United States Patent
Yuen et al.

(10) Patent No.: US 10,355,456 B2
(45) Date of Patent: Jul. 16, 2019

(54) EMITTER ARRAY WITH VARIABLE SPACING BETWEEN ADJACENT EMITTERS

(71) Applicant: Lumentum Operations LLC, Milpitas, CA (US)

(72) Inventors: Albert Yuen, Palo Alto, CA (US); Ajit Vijay Barve, San Jose, CA (US)

(73) Assignee: Lumentum Operations LLC, Milpitas, CA (US)

( * ) Notice: Subject to any disclaimer, the term of this patent is extended or adjusted under 35 U.S.C. 154(b) by 4 days.

(21) Appl. No.: 15/716,139

(22) Filed: Sep. 26, 2017

(65) Prior Publication Data

US 2019/0097397 A1    Mar. 28, 2019

(51) Int. Cl.
*H01S 5/42* (2006.01)
*H01S 5/026* (2006.01)
*H01S 5/024* (2006.01)

(52) U.S. Cl.
CPC .............. *H01S 5/423* (2013.01); *H01S 5/024* (2013.01); *H01S 5/026* (2013.01); *H01S 5/02461* (2013.01)

(58) Field of Classification Search
CPC .......... H01S 5/423; H01S 5/026; H01S 5/024; H01S 5/02461
See application file for complete search history.

(56) References Cited

U.S. PATENT DOCUMENTS

| | | | |
|---|---|---|---|
| 5,719,891 A | 2/1998 | Jewell | |
| 5,881,085 A | 3/1999 | Jewell et al. | |
| 5,903,589 A * | 5/1999 | Jewell | G02B 3/00 257/43 |
| 5,912,913 A * | 6/1999 | Kondow | B82Y 20/00 372/45.01 |
| 5,978,408 A | 11/1999 | Thornton | |
| 6,304,588 B1 | 10/2001 | Chua et al. | |
| 9,742,153 B1 | 8/2017 | Barve et al. | |
| 2001/0043629 A1 | 11/2001 | Sun et al. | |
| 2004/0165636 A1 | 8/2004 | Ezaki et al. | |
| 2005/0019973 A1 | 1/2005 | Chua | |
| 2006/0007979 A1 | 1/2006 | Jikutani et al. | |
| 2006/0285568 A1 | 12/2006 | Watanabe | |
| 2008/0205459 A1* | 8/2008 | Yonekubo | H01S 5/024 372/26 |

(Continued)

OTHER PUBLICATIONS

Co-pending U.S. Appl. No. 15/171,844, entitled "Variable Emission Area Design for a Vertical-Cavity Surface-Emitting Laser Array", by Barve et al., filed Jul. 2, 2016, 32 pages.

(Continued)

*Primary Examiner* — Armando Rodriguez
(74) *Attorney, Agent, or Firm* — Harrity & Harrity, LLP

(57) ABSTRACT

In some implementations, a VCSEL array may include a plurality of VCSELs that each operates concurrently and emits light at a same wavelength. A first distance between a first pair of adjacent VCSELs, of the plurality of VCSELs, may be different from a second distance between a second pair of adjacent VCSELs of the plurality of VCSELs. The first pair of adjacent VCSELs may be located closer to a center of the VCSEL array than the second pair of adjacent VCSELs. At least one of temperature non-uniformity or optical power non-uniformity among the plurality of VCSELs may be reduced as compared to another VCSEL array, with a same physical footprint as the VCSEL array, comprising uniformly spaced VCSELs.

20 Claims, 4 Drawing Sheets

Variable Spacing

Uniform Spacing (small)

(56) References Cited

U.S. PATENT DOCUMENTS

| | | |
|---|---|---|
| 2009/0161713 A1 | 6/2009 | Duggan et al. |
| 2010/0035372 A1 | 2/2010 | Gauggel et al. |
| 2014/0003458 A1 | 1/2014 | Han et al. |
| 2014/0160751 A1* | 6/2014 | Hogan .................. H01S 5/005 362/235 |
| 2017/0310086 A1 | 10/2017 | Barve et al. |
| 2017/0353012 A1 | 12/2017 | Barve et al. |

OTHER PUBLICATIONS

Wikipedia, "Vertical Cavity Surface Emitting Laser," https://en.wikipedia.org/wiki/vertical-cavity surface-emitting-laser, Nov. 3, 2015, 6 pages.

* cited by examiner

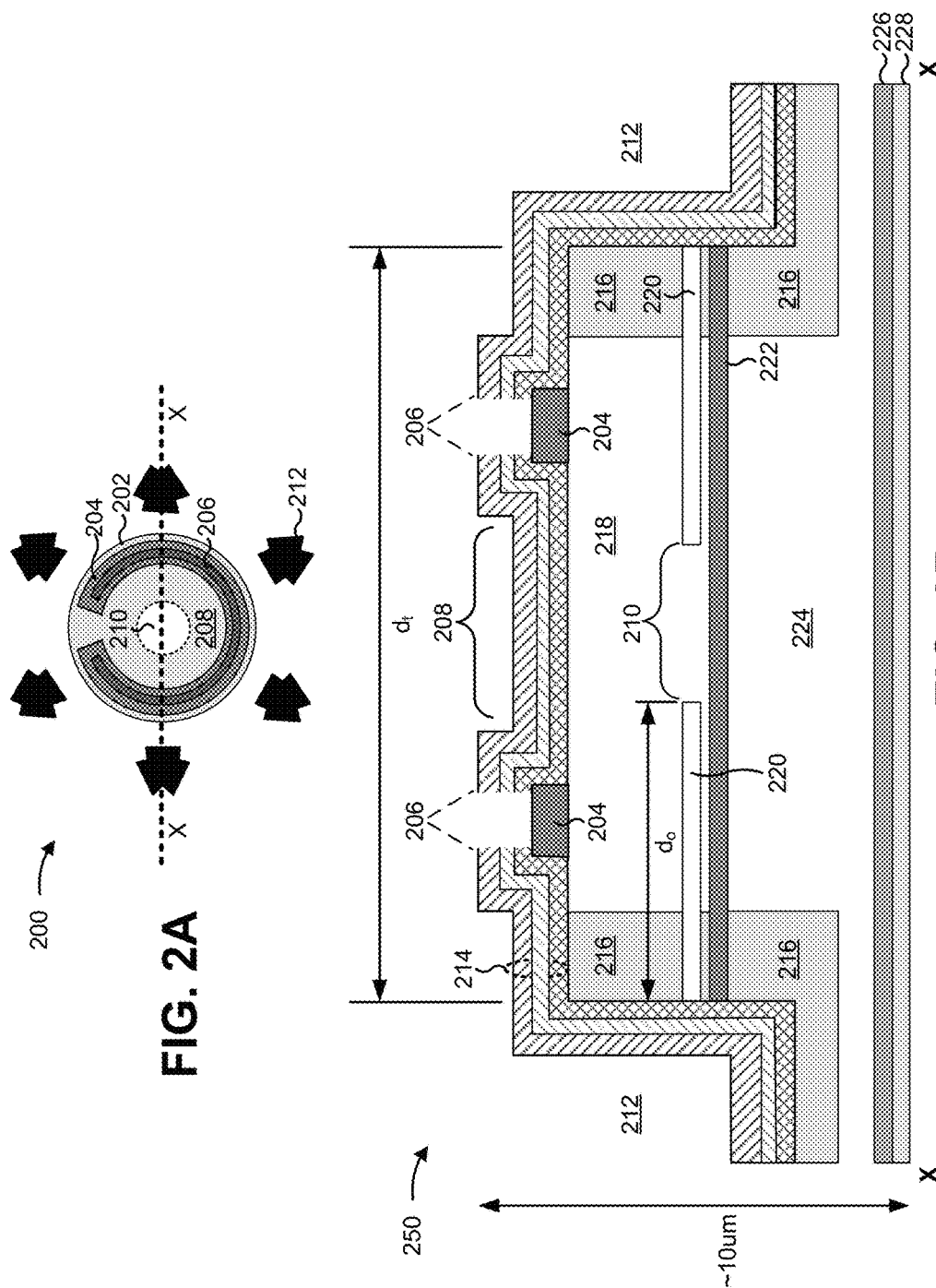

EMITTER ARRAY WITH VARIABLE SPACING BETWEEN ADJACENT EMITTERS

TECHNICAL FIELD

The present disclosure relates generally to lasers and, more particularly, to an emitter array with variable spacing between adjacent emitters.

BACKGROUND

A vertical-emitting device, such as a vertical-cavity surface-emitting laser (VCSEL), is a laser in which a laser beam is emitted in a direction perpendicular to a surface of a substrate (e.g., vertically from a surface of a semiconductor wafer). Contrary to edge-emitting devices, vertical-emitting devices may allow for testing to occur at intermediate steps of wafer fabrication.

SUMMARY

According to some possible implementations, a VCSEL array may include a plurality of VCSELs that each operates concurrently and emits light at a substantially same wavelength. A first distance between a first pair of adjacent VCSELs, of the plurality of VCSELs, may be different from a second distance between a second pair of adjacent VCSELs of the plurality of VCSELs. The first pair of adjacent VCSELs may be located closer to a center of the VCSEL array than the second pair of adjacent VCSELs. At least one of temperature non-uniformity or optical power non-uniformity among the plurality of VCSELs may be reduced as compared to another VCSEL array, with a same physical footprint as the VCSEL array, comprising uniformly spaced VCSELs.

According to some possible implementations, an emitter array may include a plurality of emitters that operate concurrently and emit laser beams at substantially same wavelengths. A distance between adjacent emitters, of the plurality of emitters, may be based on a distance between a center of the emitter array and the adjacent emitters. At least one of temperature uniformity or optical power uniformity among the plurality of emitters may be increased as compared to another emitter array, with a same physical footprint as the emitter array, comprising uniformly spaced emitters.

According to some possible implementations, a laser array may include a plurality of vertical emitting devices with variable spacing between different pairs of adjacent vertical emitting devices. The plurality of vertical emitting devices may operate concurrently to produce light at substantially same wavelengths. A spacing for a pair of adjacent vertical emitting devices, of the plurality of vertical emitting devices, may be a function of a distance between a center of the laser array and the pair of adjacent vertical emitting devices.

BRIEF DESCRIPTION OF THE DRAWINGS

FIGS. 2A and 2B are diagrams depicting a top-view of an example emitter and an example cross-sectional view of the example emitter, respectively.

DETAILED DESCRIPTION

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

Figure 1A:
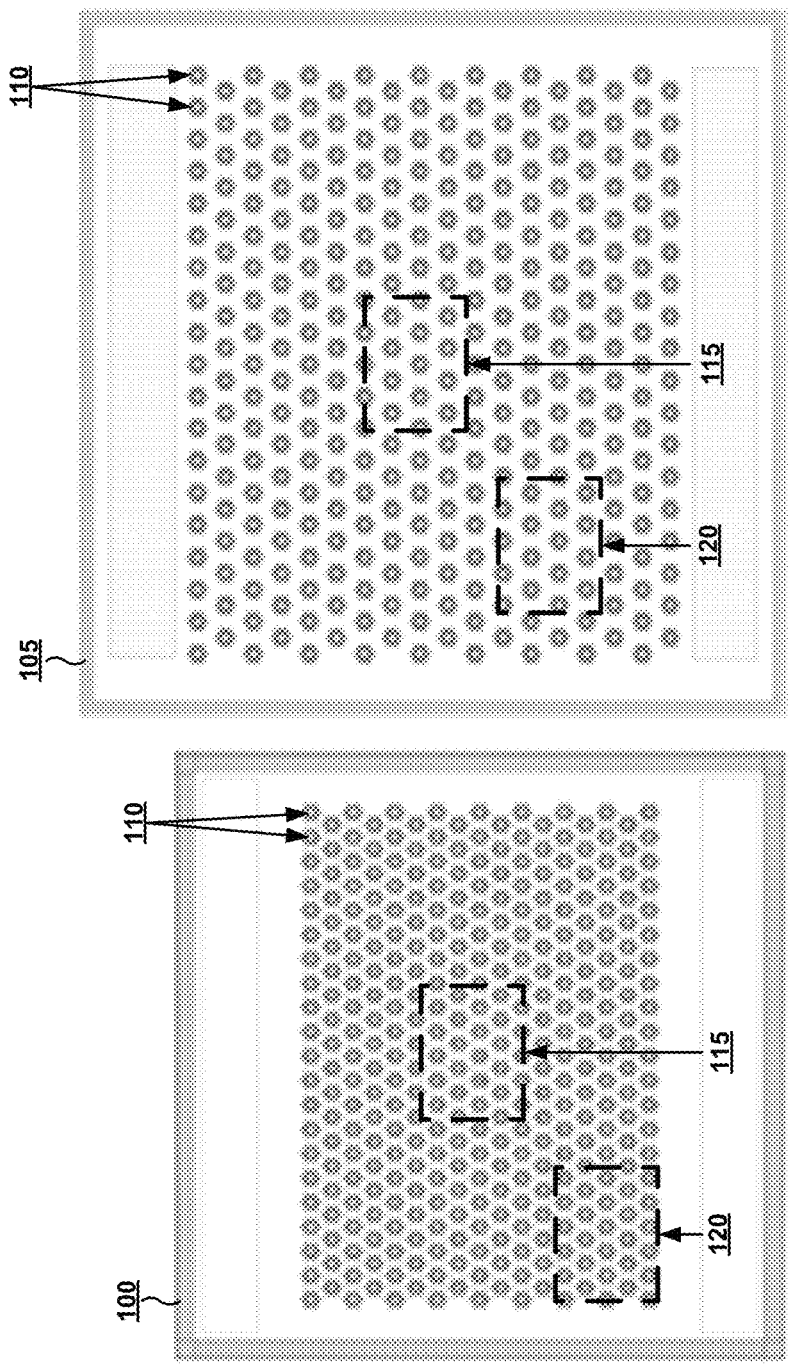
FIG. 1A is a diagram of example emitter arrays with uniform spacing between adjacent emitters.

FIG. 1A is a diagram of example emitter arrays with uniform spacing between adjacent emitters. FIG. 1A shows an example emitter array 100 with relatively small uniform spacing between adjacent emitters and an example emitter array 105 with relatively large uniform spacing between adjacent emitters. As shown, the emitter arrays 100, 105 may be two-dimensional emitter arrays. As further shown, the emitter arrays 100, 105 may include a plurality of emitters 110. An emitter 110 may include a laser, and additional details regarding emitter 110 are described elsewhere herein.

A two-dimensional emitter array, such as emitter arrays 100, 105, typically exhibit non-uniform thermal profiles throughout the array and/or throughout a chip that includes the array. For example, an inner region 115 (e.g., a central region) of the emitter array may be hotter than an outer region 120 (e.g., an edge region) due to a larger number of emitters 110 surrounding the inner region 115 (e.g., radiating outward from the inner region 115) and a smaller number of emitters 110 surrounding the outer region 120. As a result, emitters 110 located in the inner region 115 (e.g., closer to the center of the array) typically have lower light output and accelerated failure rates as compared to emitters 110 located in the outer region 120 (e.g., farther from the center of the array).

Furthermore, in emitter arrays 100, 105, thermal runaway may occur. Thermal runaway refers to a situation where an increase in temperature changes an operating condition in a way that causes a further increase in temperature (e.g., uncontrolled positive feedback), often leading to a destructive result, such as a catastrophic failure. In the case of the emitter arrays 100, 105, thermal runaway may occur when the arrays 100, 105 are driven electrically in parallel (e.g., at the same voltage). When a region of emitters 110 (e.g., the inner region 115) becomes hotter than another region of emitters 110 (e.g., the outer region 120), emitters 110 in the hot region experiences a decrease in resistance during operation, which leads to an increase in the current supplied to the emitters 110 in the hot region. This increase in current leads to a further increase in temperature, leading to a further decrease in the resistance, leading to a further increase in current. This cycle may continue until a failure occurs in the hot region of emitters 110.

In some cases, the uniform spacing between emitters 110 can be increased, as shown by emitter array 105 as compared to emitter array 100. This increase in uniform spacing may result in less heat, at a particular emitter 110, from surrounding emitters 110. However, this arrangement is still subject to thermal runaway, as described above, because the increase in uniform spacing does not resolve the relative heating or temperature difference between emitters 110 located in different regions of the emitter array 105. Even with larger uniform spacing, emitters 110 in an inner region 115 will still operate at higher temperatures than emitters 110 in an outer region 120. Furthermore, emitters 110 in an emitter array 100, 105 with uniform spacing and non-uniform thermal profiles are more likely to exhibit non-uniform performance, non-uniform optical beam profiles, non-uniform optical power (e.g., optical transmit power), and/or the like. Furthermore, this arrangement requires a larger physical footprint than an emitter array with a variable (e.g., non-uniform) spacing between adjacent emitters, which increases chip cost and production cost.

For example, the emitter arrays 100, 105 may have the same number of emitters, but different uniform spacing, resulting in different (but non-uniform) thermal performance. For example, the emitter array 105, with larger spacing between adjacent emitters, may have improved thermal performance as compared to the emitter array 100 with smaller spacing between adjacent emitters. For example, thermal runaway may occur at a higher temperature when the emitter array 105 is used, and may occur at a lower temperature when the emitter array 110 is used. However, this improvement in thermal performance is achieved with a larger chip area, which increases cost. For example, a larger chip area increases the cost per chip (e.g., because fewer chips can fit on a wafer). Furthermore, a larger chip area increases the physical footprint of a package containing the chip. Although not shown, reducing the number of emitters would also improve thermal performance, but the total optical power provided by the chip would be reduced.

Some techniques described herein use an emitter array with variable (e.g., non-uniform) spacing between adjacent emitters, as described in more detail below in connection with FIGS. 1B and 1C. This variable spacing arrangement results in a more uniform thermal profile, reduces the probability of thermal runaway, increases the temperature threshold for thermal runaway, and results in more uniform performance (e.g., more uniform optical beam profiles, more uniform optical power, and/or the like) among different emitters 110 in the emitter array as compared to an emitter array having the same number of emitters 110 with uniform spacing between adjacent emitters 110 and the same physical footprint as the emitter array with variable spacing. Furthermore, this variable spacing arrangement can be achieved without increasing the physical footprint of the array as compared to a uniformly spaced array that includes the same number of emitters 110 as the variable spaced array. In this way, a density of emitters in the emitter array can be increased without reducing the temperature at which thermal runaway occurs.

Figure 1B:
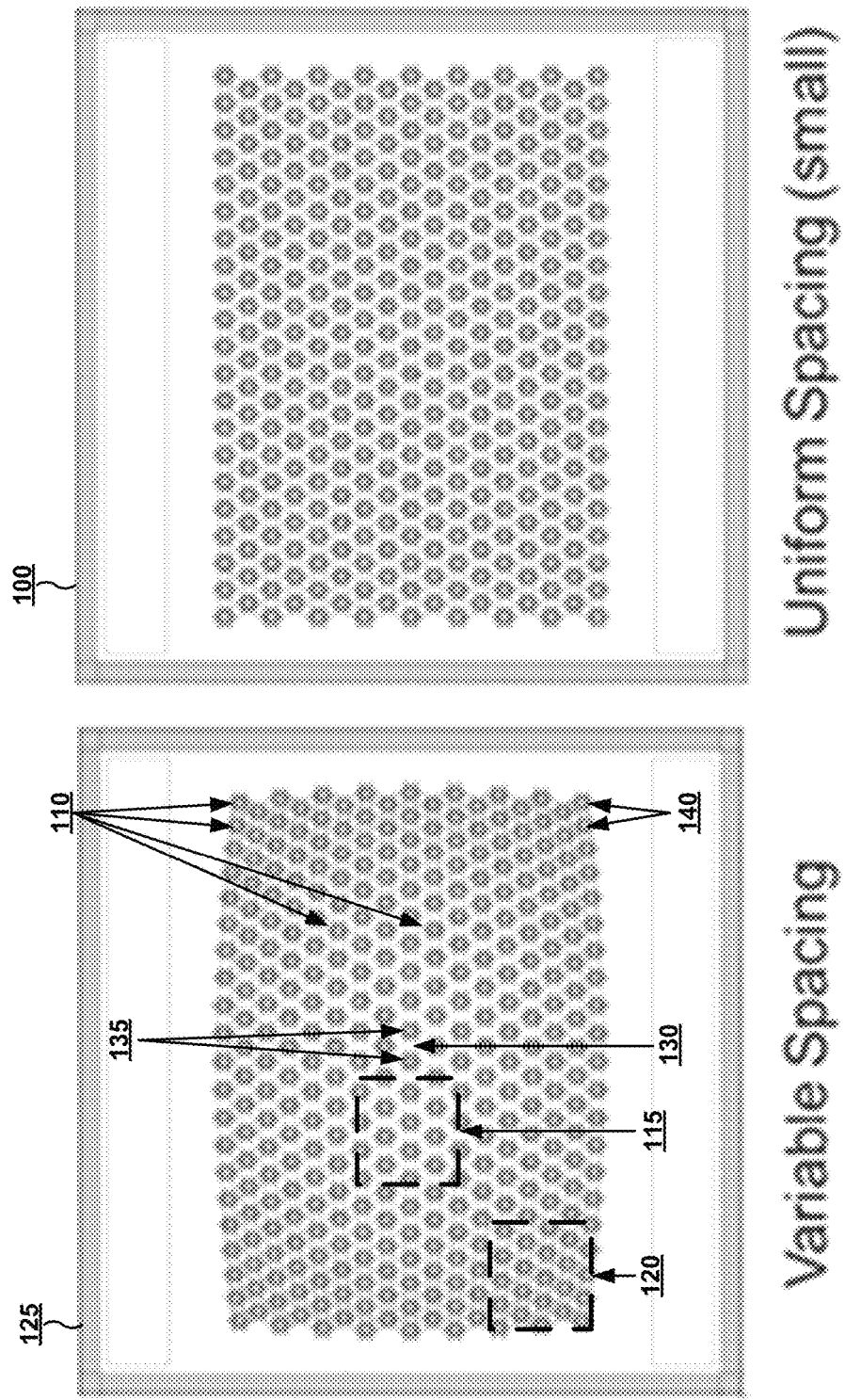
FIG. 1B is a diagram of a comparison between an example emitter array with variable spacing between adjacent emitters and an example emitter array with uniform spacing between adjacent emitters.

FIG. 1B is a diagram of a comparison between an example emitter array 125 with variable spacing between adjacent emitters and an example emitter array 100 with uniform spacing between adjacent emitters (e.g., as described above in connection with FIG. 1A) where both emitter arrays 125, 100 have the same physical footprint (e.g., occupy the same-sized area).

As shown, the variable spacing emitters array 125 may be a two-dimensional emitter array. As further shown, the emitter array 125 may include a plurality of emitters 110. An emitter 110 may include a laser, such as a vertical emitting device (e.g., a vertical emitting laser), a VCSEL, and/or the like. An example emitter 110 is described in more detail below in connection with FIGS. 2A and 2B. The emitter array 125 may be a laser array, a VCSEL array, and/or the like. In some implementations, the plurality of emitters 110 may operate concurrently, and may emit light (e.g., laser beams) at a substantially same wavelength (e.g., a same wavelength, or different wavelengths within a threshold wavelength tolerance).

As shown, the emitter array 125 may have a center 130. A first pair of adjacent emitters 135 may be located closer to the center 130 of the emitter array 125, and a second pair of adjacent emitters 140 may be located farther from the center 130 of the emitter array 125. In an emitter array 125 with variable spacing, a first distance between the first pair of adjacent emitters 135 may be different from a second distance between the second pair of adjacent emitters 140. For example, the first distance may be greater than the second distance, as shown. In this way, temperature non-uniformity and/or optical power non-uniformity among the plurality of emitters 110 in the emitter array 125 is reduced as compared to another emitter array comprising uniformly spaced emitters 110 (e.g., emitter array 100). The emitter array 125 with variable spacing may have a same physical footprint as the emitter array 100 with uniform spacing. For example, the emitter arrays 100, 125 may be the same size, may occupy the same area, may have the same dimensions (e.g., length and/or width), may include the same number of emitters 110, and/or the like. In this way, temperature uniformity and/or optical performance among emitters 110 can be increased using the same size die (e.g., which saves cost and material as compared to using a larger die, and/or may comply with a die specification).

In some implementations, a difference between the first distance, between the first pair of adjacent emitters 135, and the second distance, between the second pair of adjacent emitters 140, may be associated with reducing a difference in operating temperature between the first pair of adjacent emitters 135 and the second pair of adjacent emitters 140. For example, when a distance between adjacent emitters 110 located in an inner region 115 is greater than a distance between adjacent emitters 110 located in an outer region 120, this may reduce a difference in operating temperature among the emitters 110 in the different regions as compared to a uniformly spaced emitter array 100, thereby preventing thermal runaway, increasing thermal runaway temperature, and/or improving performance.

In some implementations, a difference between the first distance, between the first pair of adjacent emitters 135, and the second distance, between the second pair of adjacent emitters 140, may be associated with reducing a difference in optical power output between the first pair of adjacent emitters 135 and the second pair of adjacent emitters 140. For example, when a distance between adjacent emitters 110 located in an inner region 115 is greater than a distance between adjacent emitters 110 located in an outer region 120, this may reduce a difference in optical power output among the emitters 110 in the different regions as compared to a uniformly spaced emitter array 100, thereby improving performance. For example, for a uniform emitter array with a temperature difference between central emitters and outer emitters of 20° C., the non-uniformity of emitter spacing can reduce the temperature difference to 10-15° C., depending on the application. This is because the central emitters run slightly cooler, while the edge emitters run slightly hotter as compared to an emitter array with uniform spacing having the same footprint. This reduction in temperature difference would result in reduction in power non-uniformity by approximately 30% in this example.

In some implementations, the emitter array 125 is configured such that a distance between a pair of adjacent emitters 110 is based on a distance between the center 130 of the emitter array 125 and the pair of adjacent emitters 110.

For example, the distance between the pair of adjacent emitters 110 may vary linearly based on the distance between the center 130 of the emitter array 125 and the pair of adjacent emitters 110. As another example, the distance between the pair of adjacent emitters 110 may vary quadratically based on the distance between the center 130 of the emitter array 125 and the pair of adjacent emitters 110. In one example, the distance between adjacent emitters in the inner region 115 may be approximately 50 microns near the center 130 of the emitter array 125, and the distance between adjacent emitters in the outer region 120 may be approximately 35 microns near the edge of the emitter array 125.

In some implementations, the plurality of emitters 110 in the emitter array 125 may have the same aperture size (e.g., a width of an optical aperture 208 and/or a current confinement aperture 210, as described below in connection with FIGS. 2A and 2B). In this way, temperature uniformity, optical power uniformity, and/or the like, may be improved without using different aperture sizes for different emitters 110. In some implementations, at least two emitters 110, of the plurality of emitters 110, may have different aperture sizes. In some cases, temperature uniformity, optical power uniformity, and/or the like, may be further improved by using different aperture sizes for different emitters 110. See, for example, U.S. patent application Ser. No. 15/171,844 which is incorporated by reference herein in its entirety.

In some implementations, a distance between adjacent emitters 110, of the plurality of emitters 110, may be based on a distance between a center 130 of the emitter array 125 and the adjacent emitters 110. For example, a first distance between first adjacent emitters 110 may be different from a second distance between second adjacent emitters, a third distance between third adjacent emitters 110 may be different from the first distance and the second distance, and/or the like. In some implementations, the distance between adjacent emitters 110 may be a linear function or a parabolic function of the distance between the center 130 of the emitter array 125 and the adjacent emitters 110.

As an example, x and y coordinates for emitters in an emitter array with non-uniform spacing may be calculated as follows (e.g., when the distance between adjacent emitters varies quadratically), where $x(i)$ is the x coordinate of the $i^{th}$ emitter in a non-uniformly spaced emitter array, $y(i)$ is they coordinate of the $i^{th}$ emitter in the non-uniformly spaced emitter array, $x'(i)$ is the x coordinate of the $i^{th}$ emitter in a corresponding uniformly spaced emitter array (e.g., with a same physical footprint and same number of emitters), $y'(i)$ is they coordinate of the $i^{th}$ emitter in the uniformly spaced emitter array, $r(i)$ is the distance between the $i^{th}$ emitter and the center of the array, and where ax, bx, cx, ay, by, and cy are the coefficients of the quadratic equation used to calculate an amount of non-uniformity in the non-uniformly spaced emitter array, and can vary depending on the application:

$$x(i)=x'(i)\times[ax+bx\times r(i)+cx\times r(i)^2]$$

$$y(i)=y'(i)\times[ay+by\times r(i)+cy\times r(i)^2]$$

Thus, different pairs of adjacent emitters 110, included in the emitter array 125, may have variable spacing, and a spacing for a pair of adjacent emitters 110 may be a function of a distance between the center 130 of the emitter array 125 and the pair of adjacent emitters 110. In some implementations, the distance between adjacent emitters 110 may vary inversely with the distance between the center 130 of the emitter array 125 and the distance between the adjacent emitters 110. By decreasing the distance or spacing between adjacent emitters 110 as a distance from the center 130 of the emitter array 125 increases, temperature uniformity, optical power uniformity, and/or the like, may be increased as compared to a uniformly spaced emitter array 100.

Figure 1C:
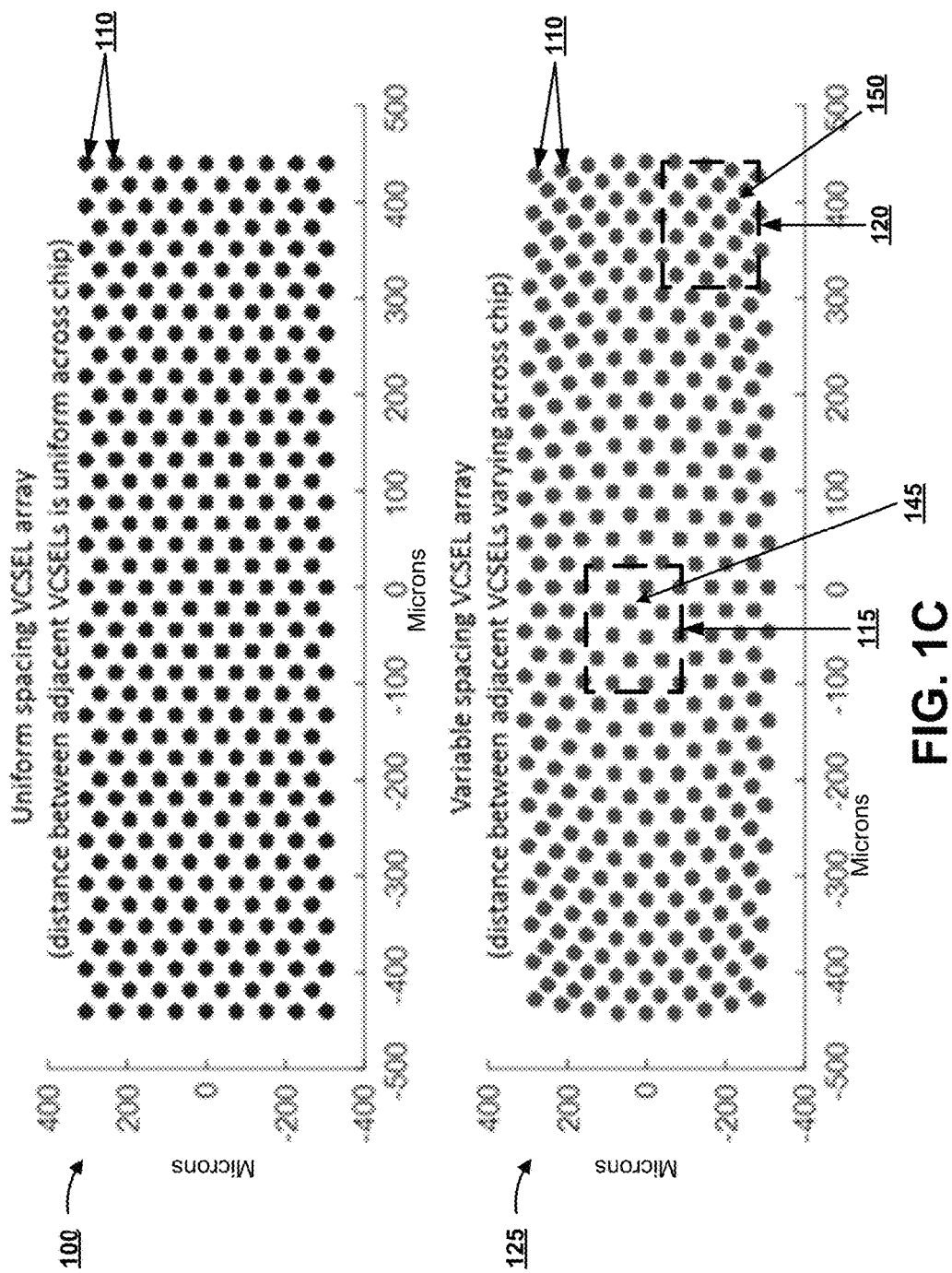
FIG. 1C is a diagram of another comparison between an example emitter array with variable spacing between adjacent emitters and an example emitter array with uniform spacing between adjacent emitters.

FIG. 1C is a diagram of another comparison between an example emitter array 125 with variable spacing between adjacent emitters 110 and an example emitter array 100 with uniform spacing between adjacent emitters 110. As shown in FIG. 1C, and as described above in connection with FIG. 1A, a first distance 145 between emitters 110 located closer to the center of the emitter array 125 (e.g., within an inner region 115) may be greater than a second distance 150 between emitters 110 located farther from the center of the emitter array 125 (e.g., within an outer region 120). Thus, a density of emitters 110 may be sparser closer to the center of the emitter array 125 (e.g., within an inner region 115), and may be denser farther from the center of the emitter array 125 (e.g., within an outer region 120). For example, there may be a smaller number of emitters 110 in an area located closer to the center of the emitter array 125, and there may be a larger number of emitters in an equal-sized area located farther from the center of the emitter array 125. In this way, a temperature gradient may be flattened across the emitter array 125 as compared to a temperature gradient of the emitter array 100, leading to improved performance of the emitter array 125 without increasing a size of the die upon which the emitter array 100, 125 is placed.

As indicated above, FIGS. 1A-1C are provided as examples. Other examples are possible and may differ from what was described in connection with FIGS. 1A-1C. For example, although a rectangular physical footprint of emitters has been illustrated for simplicity, the techniques described herein apply equally to emitter arrays having other shapes (e.g. circular, oval, hexagonal, etc.) with spacing between emitters varying from the center of the shape to the edges of the shape. Although the emitter arrays have been illustrated and described as having a single center, with more complex shapes multiple centers and/or foci may be present (e.g. an ellipse, an hourglass shape, an elongated rectangle, etc.).

FIGS. 2A and 2B are diagrams depicting a top-view of an emitter 200 and an example cross-sectional view 250 of emitter 200, respectively. As shown in FIG. 2A, emitter 200 may include a set of emitter layers constructed in an emitter architecture. For purposes of clarity, not all emitter layers of emitter 200 are shown in FIG. 2A. In some implementations, emitter 200 may correspond to emitter 110, as described above in connection with FIGS. 1A-1C.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 µm to approximately 14.0 µm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as do in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Some techniques described herein use variable spacing between adjacent emitters, included in an emitter array, to reduce temperature non-uniformity and/or reduce optical power non-uniformity across the emitter array, as compared to another emitter array that has uniformly spaced emitters. In some cases, an emitter array that uses variable spacing may have a same physical footprint as the emitter array that uses uniform spacing. In this way, temperature uniformity and/or optical performance among emitters can be increased using the same size die, thereby savings cost and material as compared to using a larger die. In this way, the threshold for thermal runaway may be increased using the same quantity of emitters and the same size die as an array of uniformly spaced emitters.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL) array, comprising:
    a plurality of VCSELs that each operates concurrently and emits light at a substantially same wavelength,
        where a first distance between a first pair of adjacent VCSELs, of the plurality of VCSELs, is different from a second distance between a second pair of adjacent VCSELs of the plurality of VCSELs,
        the first pair of adjacent VCSELs being located closer to a center of the VCSEL array than the second pair of adjacent VCSELs,
        where the VCSEL array is an M×N array and both M and N are greater than 1, and
        where the first distance is a quadratic function of a distance between a center of the VCSEL array and the first pair of adjacent VCSELs.

2. The VCSEL array of claim 1, where the first distance is greater than the second distance.

3. The VCSEL array of claim 1, where a difference between the first distance and the second distance is associated with reducing a difference in operating temperature between the first pair of adjacent VCSELs and the second pair of adjacent VCSELs.

4. The VCSEL array of claim 1, where a difference between the first distance and the second distance is associated with reducing a difference in optical power output between the first pair of adjacent VCSELs and the second pair of adjacent VCSELs.

5. The VCSEL array of claim 1, where a distance between a pair of adjacent VCSELs, of the plurality of VCSELs, is based on a distance between the center of the VCSEL array and the pair of adjacent VCSELs.

6. The VCSEL array of claim 5, where the distance between the pair of adjacent VCSELs varies linearly based on the distance between the center of the VCSEL array and the pair of adjacent VCSELs.

7. The VCSEL array of claim 5, where the distance between the pair of adjacent VCSELs varies parabolically based on the distance between the center of the VCSEL array and the pair of adjacent VCSELs.

8. The VCSEL array of claim 1, where the plurality of VCSELs have a same aperture size.

9. The VCSEL array of claim 1, where at least two VCSELs, of the plurality of VCSELs, have different aperture sizes.

10. An emitter array, comprising:
    a plurality of emitters that operate concurrently and emit laser beams at a substantially same wavelength,
        where a distance between adjacent emitters, of the plurality of emitters, is based on a distance between a center of the emitter array and the adjacent emitters,
        where a first distance between first adjacent emitters, of the plurality of emitters, is different from a second distance between second adjacent emitters of the plurality of emitters, and
        where a third distance between third adjacent emitters, of the plurality of emitters, is different from the first distance and the second distance.

11. The emitter array of claim 10, where the first adjacent emitters are located closer to the center of the emitter array than the second adjacent emitters, and where the first distance is greater than the second distance.

12. The emitter array of claim 10, where the distance between the adjacent emitters is a linear function of the distance between the center of the emitter array and the adjacent emitters.

13. The emitter array of claim 10, where the distance between the adjacent emitters is a parabolic function of the distance between the center of the emitter array and the adjacent emitters.

14. A laser array, comprising:
a plurality of vertical emitting devices with variable spacing between different pairs of adjacent vertical emitting devices,
where the plurality of vertical emitting devices operate concurrently to produce light at a substantially same wavelength,
where a first distance between first adjacent vertical emitting devices, of the plurality of vertical emitting devices, is different from a second distance between second adjacent vertical emitting devices of the plurality of vertical emitting devices, and
where a third distance between third adjacent vertical emitting devices, of the plurality of vertical emitting devices, is different from the first distance and the second distance.

15. The laser array of claim 14, where temperature non-uniformity among the plurality of vertical emitting devices is reduced as compared to another laser array, with a same physical footprint as the laser array, comprising uniformly spaced vertical emitting devices.

16. The laser array of claim 14, where optical power non-uniformity among the plurality of vertical emitting devices is reduced as compared to another laser array, with a same physical footprint as the laser array, comprising uniformly spaced vertical emitting devices.

17. The laser array of claim 14, where a first spacing, for a first pair of adjacent vertical emitting devices located closer to the center of the laser array, is greater than a second spacing for a second pair of adjacent vertical emitting devices located farther from the center of the laser array.

18. The laser array of claim 14, where a spacing for a pair of adjacent vertical emitting devices, of the plurality of vertical emitting devices, is a function of a distance between a center of the laser array and the pair of adjacent vertical emitting devices.

19. The laser array of claim 18, where the function is a linear function or a parabolic function.

20. The emitter array of claim 10, where the distance between adjacent emitters varies linearly or parabolically based on the distance between the center of the emitter array and the adjacent emitters.

* * * * *